(12) United States Patent
Tsukihara et al.

(10) Patent No.: US 7,791,049 B2
(45) Date of Patent: Sep. 7, 2010

(54) ION IMPLANTATION APPARATUS

(75) Inventors: Mitsukuni Tsukihara, Ehime (JP); Yoshito Fujii, Ehime (JP)

(73) Assignee: Sen Corporation an SHI and Axcelis Company, Tokyo (JP)

( * ) Notice: Subject to any disclaimer, the term of this patent is extended or adjusted under 35 U.S.C. 154(b) by 140 days.

(21) Appl. No.: 12/100,973

(22) Filed: Apr. 10, 2008

(65) Prior Publication Data

US 2008/0251737 A1 Oct. 16, 2008

(30) Foreign Application Priority Data

Apr. 10, 2007 (JP) ............................. 2007-103094

(51) Int. Cl.
*H01J 37/317* (2006.01)
*G21K 5/04* (2006.01)

(52) U.S. Cl. .................. 250/492.21; 250/281; 250/283; 250/289; 250/396 R; 250/398

(58) Field of Classification Search ............ 250/492.21, 250/281, 283, 286, 289, 398, 396 R
See application file for complete search history.

(56) References Cited

U.S. PATENT DOCUMENTS 6,437,351 B1 * 8/2002 Smick et al. ............ 250/492.21
6,720,563 B1 * 4/2004 Kabasawa ............... 250/492.21
2003/0160190 A1 8/2003 Kawaguchi
2008/0251713 A1 * 10/2008 Tsukihara et al. ............ 250/282

FOREIGN PATENT DOCUMENTS

| EP | 1 662 545 A2 | 5/2006 |
| JP | 2006-156259 A | 6/2006 |

* cited by examiner

*Primary Examiner*—Nikita Wells
(74) *Attorney, Agent, or Firm*—Arent Fox LLP

(57) ABSTRACT

A beam line before incidence on a beam scanner is arranged with an injector flag Faraday cup that detects a beam current by measuring a total beam amount of an ion beam to be able to be brought in and out thereto and therefrom. When the ion beam is shut off by placing the injector flag Faraday cup on a beam trajectory line, the ion beam impinges on graphite provided at the injector flag Faraday cup. At this occasion, even when the graphite is sputtered by the ion beam, since the injector flag Faraday cup is arranged on an upstream side of the beam scanner and the ion beam is shut off by the injector flag Faraday cup, particles of the sputtered graphite do not adhere to a peripheral member of the injector flag Faraday cup.

6 Claims, 7 Drawing Sheets

ION IMPLANTATION APPARATUS

This application is based upon and claims the benefit of priority from Japanese patent application No. 2007-103094, filed on Apr. 10, 2007, the disclosure of which is incorporated herein in its entirety by reference.

FIELD OF THE INVENTION

The present invention relates to an ion implantation apparatus including an injector flag Faraday cup having a function of shutting off an ion beam as necessary and measuring a beam current.

BACKGROUND OF THE RELATED ART

As a method of forming a conductive layer of an n type or a p type at a semiconductor wafer, there is used a so-called ion implantation technology of accelerating a conductive type dopant ionized by an ion source by an electric field to implant to a wafer. According to the ion implantation technology, a plasma is generated by ionizing a gas supplied to an ion source in a plasma chamber, and an ion beam is extracted from the plasma by applying a predetermined voltage to an extracting electrode. Successively, an ion beam comprising an ion having a desired mass is extracted by making the extracted ion beam incident on a mass analysis magnet apparatus, the ion beam is made to pass through a mass analysis slit, thereafter, reciprocally scanned by a beam scanner and irradiated to a wafer to thereby carry out ion implantation (see Patent Reference 1: JP-A-2006-156259).

In such an ion implantation technology, there is provided an injector flag Faraday cup having a function of shutting off an ion beam as necessary and measuring a total beam current to be able to be brought in and out to and from a beam line. Graphite is provided at a portion of the injector flag Faraday cup on which an ion beam impinges, and when the injector flag Faraday cup is inserted into the beam line, the ion beam is shut off by making the ion beam impinge on the graphite.

Specifically, as shown by FIG. 1A and FIG. 1B, an injector flag Faraday cup 200 is provided at inside of a scanner housing 310 along with a beam scanner 300. As explained later, the beam scanner 300 is for periodically reciprocating an incident ion beam in a horizontal direction orthogonal to an advancing direction thereof by a pair of scanning electrodes 300-1 and 300-2 arranged to be opposed to each other to interpose a beam trajectory line. An upstream side and a downstream side of the beam scanner 300 are respectively provided with scanner suppression electrodes 320 and 330 for restraining diversion of the ion beam and restricting a section size of the ion beam. The injector flag Faraday cup 200 is arranged at a portion in correspondence with a downstream side adjacent to the scanner suppression electrodes 330.

The injector flag Faraday cup 200 is provided with a receiving area in correspondence with a range of scanning the ion beam by the beam scanner 300 and is made to be brought in and out to and from the beam line by a drive mechanism (not illustrated) installed at outside of the scanner housing 310, in this case, by being driven in an up and down direction. For example, during a time period until interchanging a wafer finished with ion implantation by a wafer which has not been implanted yet, the injector flag Faraday cup 200 is placed at the beam line to shut off the ion beam. A portion of the injector flag Faraday cup 200 on which the ion beam impinges is covered by a material of graphite or the like which is strong at sputtering by the ion beam.

SUMMARY OF THE INVENTION

However, when the ion beam impinges on a graphite inner wall member at the injector flag Faraday cup 200, there is a case of bringing about sputtering of graphite. There is a case in which a sputtered graphite particle is adhered to peripheral members on an upstream side of the injector flag Faraday cup 200, particularly to the scanner suppression electrodes 330 or the scanning electrodes 300-1 and 300-2 to contaminate, further, a part of the scanner suppression electrodes 330 and the scanning electrodes 300-1 and 300-2 are exfoliated by secondary sputtering.

When the scanner suppression electrodes 330 or the scanning electrodes 300-1 and 300-2 are contaminated or exfoliated in this way, there is a concern that the ion beam cannot reciprocally be scanned accurately. Further, when a large amount of graphite is adhered to between the scanner housing 310 and the scanner suppression electrodes 330 to bring about short-circuit, the ion beam cannot reciprocally be scanned.

The present invention has been carried out in view of such a problem and it is an object thereof to provide an ion implantation apparatus in which a peripheral member thereof is not effected with an adverse influence by an injector flag Faraday cup and which can particularly maintain the beam scanner in an optimum state.

An ion implantation apparatus according to the present invention includes a beam line for implanting an ion to a wafer by irradiating an ion beam extracted from an ion source and passed through a mass analysis magnet apparatus and a mass analysis slit to the wafer by being reciprocally scanned by a beam scanner. According to an aspect of the present invention, the beam line after passing the mass analysis slit before incidence of the beam scanner is arranged with a Faraday cup that detects a beam current by measuring a total beam amount of the ion beam to be able to be brought in and out thereto and therefrom.

In the ion implantation apparatus according to the present invention, it is preferable that further includes a scanner housing that contains the beam scanner and the Faraday cup. In this case, the Faraday cup is arranged immediately after an ion beam inlet at the scanner housing and the beam scanner is arranged immediately after the Faraday cup.

In the ion implantation apparatus according to the present invention, it is preferable that a shape of a beam incident portion at the Faraday cup is constituted by a rectangular shape to be able to deal with an ion beam having a section in an elliptical shape having a long axis in a lateral direction or a longitudinal direction.

In the ion implantation apparatus according to the present invention, it is preferable that a drive mechanism which brings in and out the Faraday cup to and from the beam line is installed at outside of the scanner housing and the Faraday cup is attached to a drive shaft of the drive mechanism introduced into the scanner housing by penetrating an wall of the scanner housing.

In the ion implantation apparatus according to the present invention, it may further includes a beam dump arranged at a most downstream position of the beam line and having a beam current detecting function. In this case, a beam transporting efficiency is made to be able to be calculated by comparing a detected value of the Faraday cup and a detected value of the beam dump.

In the ion implantation apparatus according to the present invention, it may further include a profile monitor which measuring a current density distribution of a section of the ion beam. In this case, the profile monitor is arranged at a immediate vicinity on an upstream side or an immediate vicinity on a downstream side of the Faraday cup at inside of the scanner housing.

In the ion implantation apparatus according to the present invention, it may further include a dose amount measurement unit arranged at a vicinity of the wafer, a determination portion that determines whether the measured dose amount is proper, a deflecting apparatus arranged at a section of the beam line from an outlet of the mass analysis magnet apparatus to a front side of the mass analysis slit for deflecting the ion beam in a predetermined direction deviated from the beam trajectory line and maintaining the deflection, and a control portion that carries out temporal evacuating by the deflecting apparatus when the dose amount measured in implanting the ion is determined to be improper by the determination portion. In this case, the control portion recovers the ion beam to the beam trajectory line by stopping the temporal evacuating when a predetermined time period has elapsed since the dose amount has been determined to be improper, and when the dose amount remeasured by the dose amount measurement portion is determined to be improper again, the control portion inserts the Faraday cup to the beam line and releases the temporal evacuating.

In the ion implantation apparatus according to the present invention, the injector flag Faraday cup is inserted to the beam line on the upstream side of the beam scanner. Thereby, when the ion beam extracted from the ion source is shut off by the injector flag Faraday cup, the ion beam impinges on the injector flag Faraday cup. At this occasion, the ion beam is shut off by the injector flag Faraday cup arranged on the upstream side of the beam scanner, and therefore, even when sputtering is brought about by the ion beam, sputtered particles do not adhere to the peripheral member, for example, the scanning electrodes of the beam scanner. Therefore, the scanning electrodes of the beam scanner can be maintained in an optimum state, as a result, the ion beam can accurately be scanned reciprocally by the beam scanner. In addition thereto, a large amount of sputtered particles do not adhere to the scanning electrodes of the beam scanner, and therefore, a concern of short-circuiting the scanner housing containing the beam scanner and the like and the scanning electrodes of the beam scanner can firmly be prevented.

Further, the injector flag Faraday cup can be made to be smaller than that of a constitution of arranging the injector flag Faraday cup at a vicinity of a downstream side of the beam scanner. This is because according to the constitution arranging the injector flag Faraday cup on the downstream side of the beam scanner, there is needed an injector flag Faraday cup having a receiving area adapted to a range of scanning the ion beam by the beam scanner. In contrast thereto, because it is unnecessary to prepare an injector flag Faraday cup having a receiving area adapted to the range of scanning the ion beam since according to the constitution of arranging the injector flag Faraday cup on the upstream side of the beam scanner, the injector flag Faraday cup is placed before the place being reciprocally scanned with the ion beam by the beam scanner. As a result, by only constructing a constitution of arranging the injector flag Faraday cup on the upstream side of the beam scanner, the constitution can contribute to small-sized formation of the injector flag Faraday cup.

DETAILED DESCRIPTION OF THE PREFERRED EMBODIMENTS

Figure 1A:
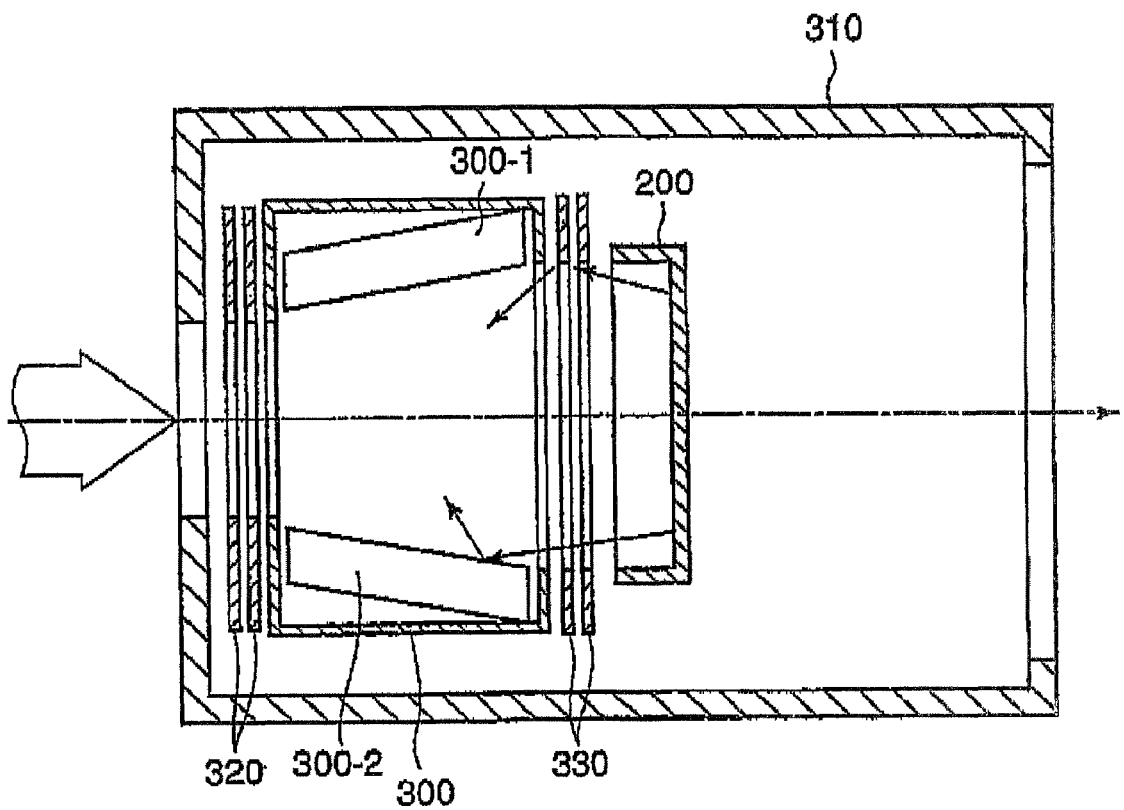
FIG. 1A is a plane sectional view for explaining a problem when an injector flag Faraday cup is arranged on a downstream side of a beam scanner in an ion implantation apparatus of a related art.
Figure 1B:
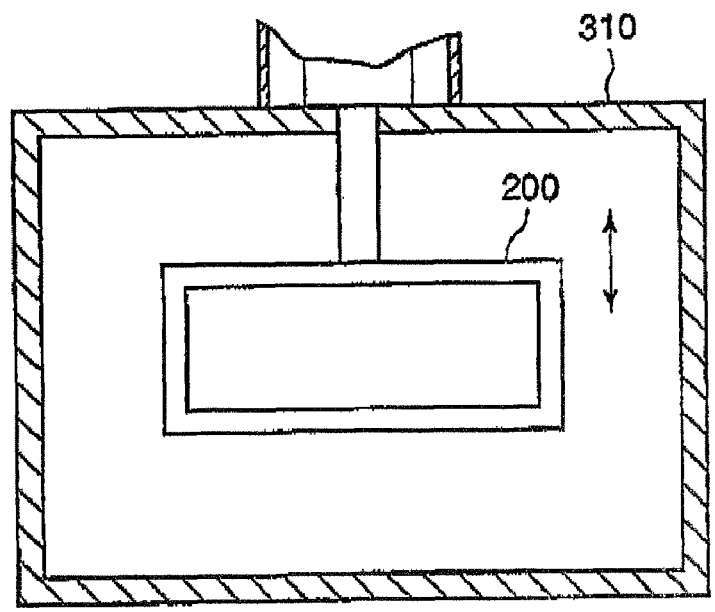
FIG. 1B is a front view viewing the injector flag Faraday cup shown in FIG. 1A from an upstream side.
Figures 2A, 2B:
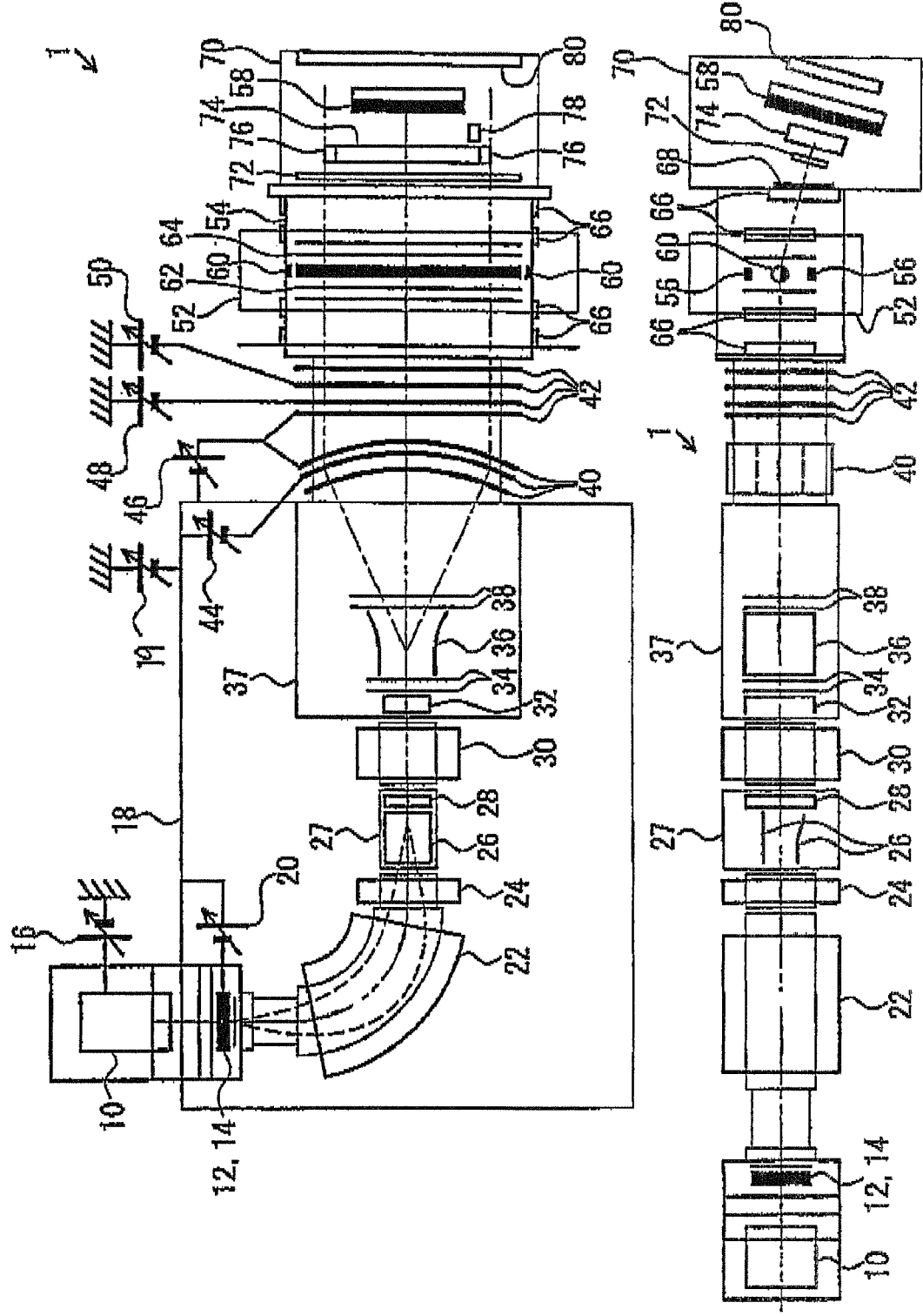
FIG. 2A is a plane view schematically showing a constitution when the present invention is applied to an ion implantation apparatus of a single wafer type.
FIG. 2B is a view schematically showing the ion implantation apparatus shown in FIG. 1A from a side face thereof.

An embodiment of an ion implantation apparatus according to the present invention will be explained in reference to the drawings as follows. FIG. 2A and FIG. 2B are schematic views when the present invention is applied to an ion implantation apparatus of a single wafer type, particularly, FIG. 2A is a plane view and FIG. 2B is a side view. A constitution of the ion implantation apparatus 1 will be explained from the most upstream side of a beam line constituting a start point by an ion source 10. An outlet side of the ion source 10 is provided with an extracting electrode 12 for extracting an ion beam from a plasma generated at inside of an ion chamber. A vicinity of a downstream side of the extracting electrode 12 is provided with a suppression electrode 14 for restraining an electron included in the ion beam extracted from the extracting electrode 12 from flowing back to the extracting electrode 12. The ion source 10 is connected with an ion source high voltage power source 16 and an extracting power source 20 is connected to between the extracting electrode 12 and a terminal 18.

A downstream side of the extracting electrode 12 is arranged with a mass analysis magnet apparatus 22 for extracting an ion beam comprising a desired ion by separating an ion other than the desired ion from an incident ion beam. A downstream side of the mass analysis magnet apparatus 22 is arranged with a first quadrupole vertically focusing electromagnet 24 for focusing or converging an ion beam in a longitudinal (vertical) direction, a park electrode (deflecting apparatus) 26 for deflecting an ion beam from a beam trajectory lines a mass analysis slit 28 for passing an ion beam comprising an ion of a desired mass in the ion beam, and a second quadrupole vertically focusing electromagnet 30 for focusing or converging an ion beam in a longitudinal direction. The park electrode 26 and the mass analysis slit 28 are contained in a park housing 27 constituted by a material in which cross contamination of aluminum or the like is hardly present. Further, as the mass analysis slit 28, other than an exclusive slit of a fixed type, a plurality of stages of switching type mass analysis slits may be used. According to the plurality of stages of the switching type mass analysis slits, three stages of slit sizes of, for example, an elliptical/or an oval type slit for high beam current, a long and narrow circular slit for a low beam current, and an extremely small diameter slit for confirming a beam trajectory axis are mechanically switched.

A downstream side of the second quadrupole vertically focusing electromagnet 30 is arranged with an injector flag Faraday cup 32 for shutting off an ion beam as necessary and measuring a beam current, and a beam scanner 36 for periodically reciprocating to scan the ion beam in a horizontal direction orthogonal to a direction of advancing the ion beam. An upstream side and a downstream side of the beam scanner 36 are respectively provided with scanner suppression electrodes 34 and 38 having openings capable of restricting also a size of a sectional size of the ion beam, restraining diversion of the ion beam and shielding a scanning electric field from a surrounding. Further, the injector flag Faraday cup 32 is made to be able to be inserted and taken out to and from the beam line by a drive mechanism in an up and down direction in this case as explained later. Further, the injector flag Faraday cup 32, the beam scanner 36 and the scanner suppression electrodes 34 and 38 are contained in a scanner housing 37 made of aluminum.

Respective members on the beam line from the extracting electrode 12 to the scanner housing 37 are contained in the terminal 18. The terminal 18 is connected with a terminal power source 19. Therefore, potentials of the park housing 27 and the scanner housing 37 are the same as a potential of the terminal 18 to constitute the potential of the terminal power source 19.

A downstream side of the beam scanner 36 is arranged with a parallel lens 40 for redeflecting an ion beam deflected to have an angle in a horizontal direction relative to a center trajectory (center trajectory of ion beam before being scanned by the beam scanner 36) to be in parallel with the center trajectory, and an accelerating/decelerating column 42 for accelerating or decelerating the ion beam. The parallel lens 40 is constituted by a plurality of electrodes in a circular arc shape bored with holes for passing the ion beam at centers thereof. A first electrode from an upstream side of the parallel lens 40 is maintained at the terminal potential. A second electrode is referred to as a suppression electrode for restraining an electron from flowing in by being connected with the suppression power source 44. A third electrode is connected with a parallel lens power source 46, thereby, an electric field is generated between the second electrode and the third electrode, and an ion beam deflected in a horizontal direction becomes an ion beam in parallel with a center trajectory before being deflected. The parallel lens 40 is constructed by a structure of utilizing the electric field and the ion beam is decelerated by a potential difference between the second electrode and the third electrode. That is, the ion beam deflected by the beam scanner 36 is corrected in a trajectory thereof in a direction in parallel with a center trajectory before being deflected by the electric field between the second electrode and the third electrode and decelerated.

The accelerating/decelerating column 42 is constituted by one or more of electrodes in a linear shape. A first electrode from an upstream side of the accelerating/decelerating column 42 is connected with the parallel lens power source 46 similar to the third electrode of the parallel lens 40. Second and third electrodes are respectively connected with a first accelerating/decelerating column power source 48 and a second accelerating/decelerating column power source 50. The ion beam is accelerated or decelerated by adjusting voltages of the power sources. Further, a fourth electrode is grounded to a ground potential. A downstream side of the accelerating/decelerating column 42 is arranged with an angular energy filter (hereinafter, referred to as AEF) 52 of a hybrid type. AEF 52 is an energy filter for selecting the ion beam achieving an aimed acceleration energy. AEF 52 includes a magnetic deflecting electromagnet for magnetic field deflection and a static deflecting electrode for static deflection. The magnetic deflecting electromagnet is arranged to surround an AEF chamber 54 and is constituted by a yoke member surrounding upper and lower and left and right sides of the AEF chamber 54 and a group of coils wound around the yoke member. Further, the magnetic deflecting electromagnet is connected with a direct current voltage power source (not illustrated).

On the other hand, the static deflecting electrode is constituted by a pair of upper and lower AEF electrodes 56 and arranged to interpose an ion beam from up and down directions. In the pair of AEF electrodes 56, the AEF electrode 56 on an upper side is applied with a positive voltage and the AEF electrode 56 on a lower side is applied with a negative voltage, respectively. In deflecting by a magnetic field, an ion beam is deflected to a lower side by about 20 degrees by the magnetic field from the magnetic deflecting electromagnet and only an ion beam of an aimed energy is selected. On the other hand, in deflecting by the magnetic field and the electric field, or only the electric field, the ion beam is deflected to the lower side by about 20 degrees by a combining operation by the magnetic field from the magnetic deflecting electromagnet and the electric field generated between the pair of AEF electrodes 56, or a deflecting operation of the electric field and only an ion beam of an aimed energy is selected.

In this way, AEF 52 is of the hybrid type using the magnetic field, the electric field, and both of the magnetic field and the electric field as necessary, and therefore, in transporting a low energy beam, the magnetic field having a high electron confining effect can mainly be used and in transporting a high energy beam, in addition to using both of the magnetic field deflection and the static deflection, a deflecting operation of only the electric field can be used. Further, a way of use differs by an energy or a kind of a gas of the ion source 10 when the magnetic field is always used, or when both of the magnetic field and the electric field is used or the deflecting operation of only the electric field is used.

AEF 52 is provided with an AEF plasma shower 60 for promoting an efficiency of transporting an ion beam to a wafer 58 by restraining diversion of the ion beam by supplying an electron. Further, AEF 52 is respectively provided with AEF suppression electrodes 62 and 64 on an upstream side and a downstream side of the AEF plasma shower 60. The AEF suppression electrodes 62 and 64 mainly serve to restrict an electron barrier and a size of a sectional shape of the ion beam.

A wall of the AEF chamber 54 is arranged with a plurality of permanent magnets 66 for forming a cusp magnetic field. By forming the cusp magnetic field, an electron is confined to inside of the AEF chamber 54. The respective permanent magnets 66 are arranged such that magnetic poles thereof are directed to inside of the AEF chamber 54 and the contiguous magnetic poles have opposite magnetic poles. Further, an outlet side of the AEF chamber 54 is provided with a striker plate 68 for receiving a neutral particle or the like constituted by neutralizing an ion advancing straight without being deflected by AEF 52.

A processing chamber (vacuum processing chamber) 70 is connected with the AEF chamber 54. Selectable energy slits (hereinafter, referred to as SES) 72 are arranged at inside of the processing chamber 70. The selectable energy slits 72 are arranged to interpose the ion beam from up and down directions. Upper and lower selectable slits each includes 4 of slit faces, after selecting the slit face, by further adjusting axes of the upper and lower selectable slits in the up and down direction, and rotating the axes, a desired slit width is provided. By successively selecting 4 of the silt faces in accordance with a species of an ion, cross contamination is reduced.

A plasma shower 74 supplies a low energy electron to a front face of the wafer 58 along with the ion beam, neutralizes and restrains charge up of a positive charge produced by ion implanting. Dose cups 76 respectively arranged at left and right ends of the plasma shower 74 measure a dose amount. Specifically, the dose cup is connected with a current measurement circuit and the dose amount is measured by measuring a beam current which flows by making the ion beam incident thereon.

A beam profiler 78 includes a beam profiler cup (not illustrated) for measuring the beam current at an ion implanting position and a vertical profile cup (not illustrated) for measuring a beam shape and a beam X-Y position. The beam profiler 78 measures an ion beam density at the ion implanting position while being moved in a horizontal direction before implanting an ion or the like. When a predicted non uniformity (PNU) of the ion beam does not satisfy a request of the process as a result of measuring the beam profile, an applied voltage or the like of the beam scanner 36 is automatically adjusted to satisfy a process condition. The vertical profiler cup confirms a beam width and a beam center position by measuring the beam shape at the ion implanting position.

The most downstream side of the beam line is arranged with a triple surface beam dump (TSBD) 80 having a beam current measurement function similar to that of a Faraday cup for measuring a final setup beam. The triple surface beam dump 80 reduces cross contamination by switching three faces of a triangular pillar in accordance with a kind of a gas of the ion source 10. Further, the beam line is naturally maintained in high vacuum.

Figure 3A:
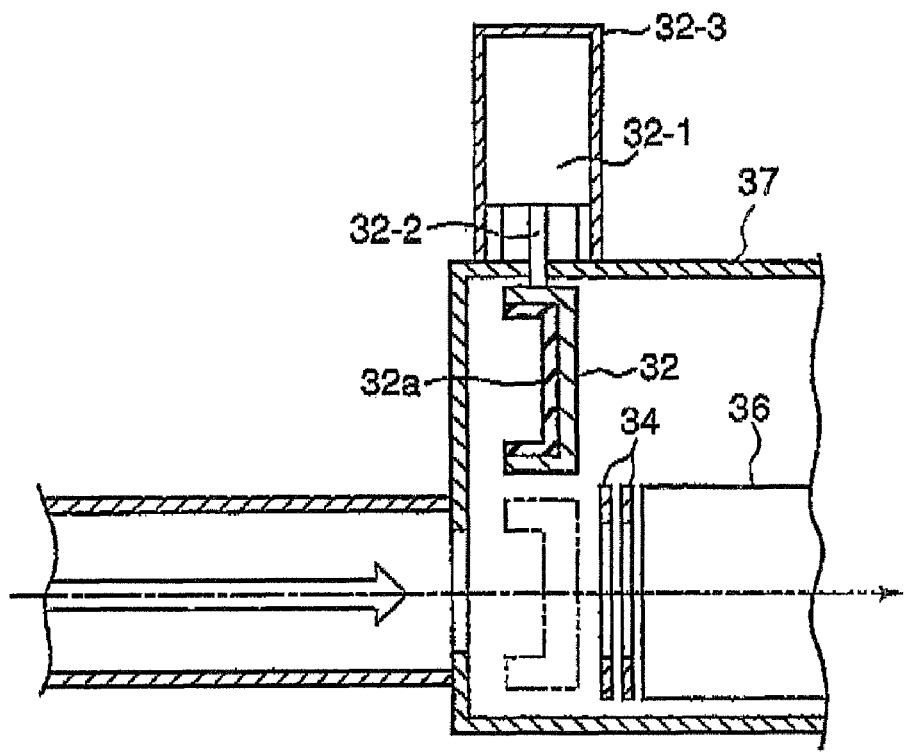
FIG. 3A is a side sectional view showing an injector flag Faraday cup shown in FIG. 2A and a structure of a periphery thereof.
Figure 3B:
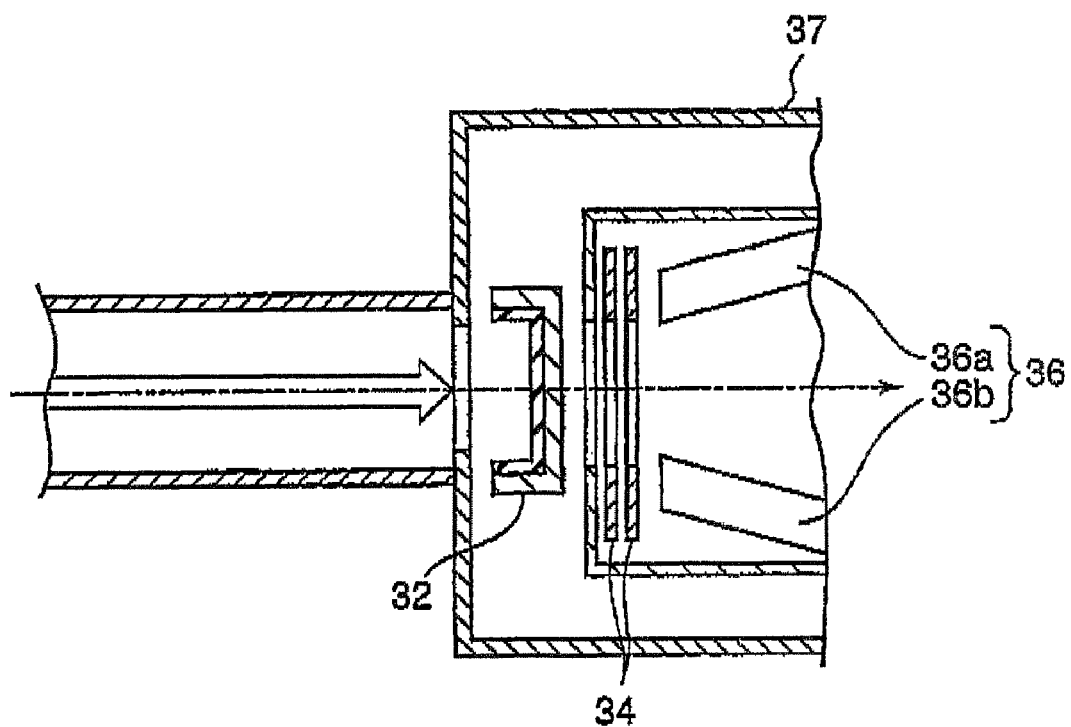
FIG. 3B is a plane sectional view of FIG. 3A.

An explanation will be given of the injector flag Faraday cup 32 of the ion implantation apparatus 1 constituted as described above in reference to FIG. 3A and FIG. 3B. FIG. 3A is a side sectional view showing the injector flag Faraday cup 32 and a structure of a periphery thereof, and FIG. 3B is a plane sectional view thereof. In the ion implantation apparatus 1 according to the embodiment, the injector flag Faraday cup 32 is arranged on an upstream side of the beam scanner 36 and at inside of the scanner housing 37. Specifically, the injector flag Faraday cup 32 is arranged immediately after an ion beam inlet at the scanner housing 37 and the beam scanner 36 is arranged immediately after the injector flag Faraday cup 32. As shown by FIG. 3B, the beam scanner 36 is provided with a pair of scanning electrodes 36a and 36b arranged to increase a distance of being separated from each other along a beam trajectory line indicated by a one-dotted chain line.

Here, a drive mechanism 32-1 is provided on an outer side of the scanner housing 37 to drive the injector flag Faraday cup 32 in an up and down direction to be brought in and out to and from the beam line. A drive shaft 32-2 is introduced from the drive mechanism 32-1 into the scanner housing 37 and the injector flag Faraday cup 32 is attached to a lower end of the drive shaft 32-2. In order to prevent a vacuum state (reduced pressure state) at inside of the scanner housing 37 from being deteriorated, the drive mechanism 32-1 is contained at inside of a housing 32-3 to be maintained in an airtight state and also a surrounding of the drive shaft 32-2 penetrating the scanner housing 37 is sealed.

The injector flag Faraday cup 32 is used for measuring a current of the ion beam, normally arranged at an evacuating position indicated by a bold line in FIG. 3A, and is placed on the beam trajectory line as indicated by a two-dotted chain line in the drawing by being moved down in measuring.

A principle of measuring the beam current by the injector flag Faraday cup 32 is as follows. The injector flag Faraday cup 32 is grounded by way of a terminal beam monitor controller (not illustrated). When the injector flag Faraday cup 32 is placed on the beam trajectory line, an electron in correspondence with the ion advancing to the injector flag Faraday cup 32 flows from the ground to the injector flag Faraday cup 32 to neutralize the ion. The terminal beam monitor controller measures an amount of electrons flowing for neutralizing the ion and calculates a beam current amount.

The injector flag Faraday cup 32 may be provided with a receiving area in correspondence with a sectional shape of an ion beam incident thereon. That is, in the case of the example, although since the sectional shape of the ion beam incident on the injector flag Faraday cup 32 is constituted by an elliptical or a flat shape having a long axis in a lateral direction, and the injector flag Faraday cup is located before the location where the ion beam is reciprocally scanned, a beam receiving area of the injector flag Faraday cup 32 may be constituted by a rectangular shape slightly larger than a sectional shape of the ion beam.

Graphite 32a is provided at a portion of the injector flag Faraday cup 32 on which the ion beam impinges, specifically, a face utilized for detecting the beam current. When the injector flag Faraday cup 32 is moved down to be arranged on the beam trajectory line, the ion beam advances to the injector flag Faraday cup 32 to impinge on the graphite 32a. At this occasion, even when the graphite 32a is sputtered by the ion beam, since the injector flag Faraday cup 32 is arranged on the upstream side of the beam scanner 36 and the ion beam is shut off by the injector flag Faraday cup 32, particles of the scattered graphite 32a are not adhered to the scanning electrodes 36a and 36b of the beam scanner 36. Therefore, the scanning electrodes 36a and 36b of the beam scanner 36 can be maintained in an optimum state, as a result, the ion beam can accurately be scanned reciprocally by the beam scanner 36.

Further, a large amount of particles of the graphite 32a do not adhere to the scanning electrodes 36a and 36b of the beam scanner 36, and therefore, the concern of short-circuiting the scanner housing 37 containing the beam scanner 36 and the like and the scanning electrodes 36a and 36b of the beam scanner 36 can firmly be prevented. Further, the injector flag Faraday cup 32 can be made to be smaller than that of the related art constitution of arranging the injector flag Faraday cup 200 on the downstream side of the beam scanner 300. This is due to the following reason. According to the related art constitution of arranging the injector flag Faraday cup on the downstream side of the beam scanner, there is needed an injector flag Faraday cup having a receiving area adapted to a wide range of reciprocally scanning the ion beam. In contrast thereto, according to the constitution of the embodiment of arranging the injector flag Faraday cup 32 on the upstream side of the beam scanner 36, the ion beam is not reciprocally scanned, and therefore, the receiving area of the injector flag Faraday cup 32 can be made to be small. Particularly, the ion beam incident on the injector flag Faraday cup 32 is converged by the quadrupole vertically focusing electromagnet 30 arranged at a prestage thereof, and therefore, the sectional shape is further reduced. As a result thereof, a size of a total of the injector flag Faraday cup 32 can be reduced.

On the other hand, when the injector flag Faraday cup 32 is moved up to evacuate from the ion beam, the ion beam advances to the beam scanner 36 arranged on the downstream side. The scanning electrodes 36a and 36b of the beam scanner 36 are maintained in the optimum state, and therefore, the ion beam arriving at the beam scanner 36 is accurately scanned reciprocally.

Further, a beam transporting efficiency can be calculated by comparing a detected value of the injector flag Faraday cup 32 and a detected value of a triple surface beam dump 80.

Figure 4:
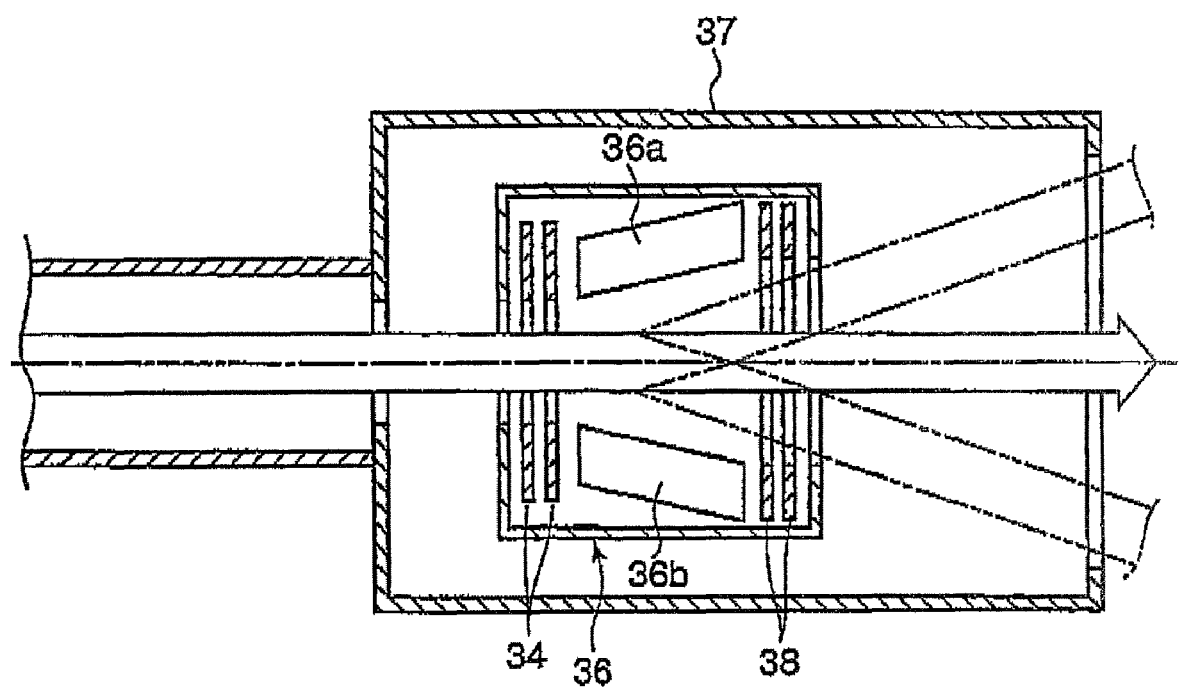
FIG. 4 is a plane sectional view showing a behavior of reciprocally scanning an ion beam at inside of a scanner housing.

FIG. 4 is a plane sectional view showing a behavior of reciprocal scanning of the ion beam at inside of the scanner housing 37.

Next, an explanation will be given of a function of shutting off the ion beam carried out by combining the park electrode 26 and the injector flag Faraday cup 32.

Figure 5:
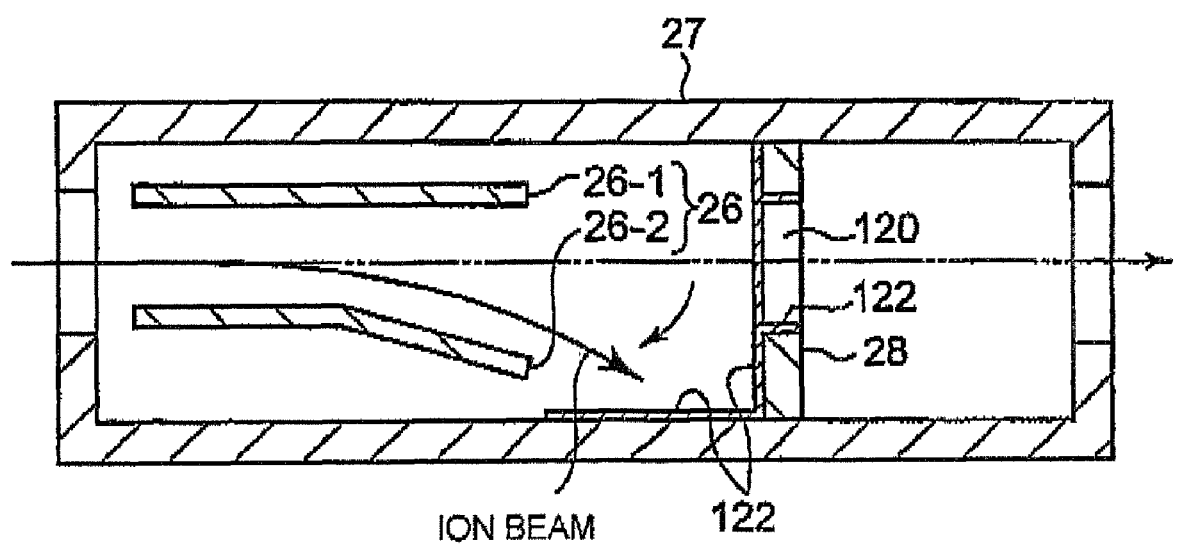
FIG. 5 is a side sectional view for explaining a park electrode and a mass analysis slit and a park housing containing these provided at an ion implantation apparatus according to the present invention.

FIG. 5 is a vertical sectional view showing the park electrode 26 and the mass analysis slit 28 and the park housing 27 containing these. In FIG. 5, at the beam trajectory line indicated by a two-dotted chain line, the park electrode 26 comprising a plus electrode 26-1 and a minus electrode 26-2 is arranged on a front side of the mass analysis slit 28, that is, on the upstream side. The park electrode 26 and the mass analysis slit 28 are contained in the park housing 27 comprising aluminum. A center of the mass analysis slit 28 is provided with a hole 120 for passing an ion beam comprising an ion of a predetermined mass in the ion beam. A face on the upstream side of the mass analysis slit 28, a wall face of the hole 120 and an inner wall face of the park housing 27 in correspondence with a downstream side of the minus electrode 26-2 are covered by a graphite 122. The graphite 122 is difficult to be sputtered and difficult to be exfoliated even when the ion beam impinges thereon.

In FIG. 5, when a park voltage is not applied to the park electrode 26 and there is not a potential difference between the plus electrode 26-1 and the minus electrode 26-2 and the electric field is not present at the park electrode 26, the ion beam from the mass analysis magnet apparatus 22 passes the park electrode 26 along the beam trajectory line. Among the ion beam having passed the park electrode 26, the ion beam composed of ions of a predetermined mass passes the hole 120 of the mass analysis slit 28. The ion beam passing the hole 120 of the mass analysis slit 28 advances to the beam scanner 36 disposed on the downstream side (refer to FIG. 2A).

On the other hand, when the electric field is present at the park electrode 26 comprising the plus electrode 26-1 and the minus electrode 26-2 by applying the park voltage, the ion beam from the mass analysis magnet apparatus 22 is deflected to a lower side to the side of the minus electrode 26-2 by the park electrode 26 as shown by a bold line in FIG. 5. In a case of an extracting voltage equal to or higher than several tens kV at the ion source 10, a voltage applied to the minus electrode 26-2 is preferably around 10% thereof, for example, around −10 kV. Evacuating of the ion beam by such a deflection is much faster (microsecond order) than that of a deflection which is carried out mechanically, and is referred to as high speed evacuating. The deflected ion beam maintains a state of impinging on a face on the upstream side of the mass analysis slit 28 or impinging on the graphite 122 of the inner wall of the park housing 27. The state normally continues for a short period of time of about several seconds and is referred to as temporary evacuating of the ion beam. When the potential difference is nullified by making the power source applied to the park electrode 26 off in such a state, there is brought about a state in which the electric field is not present at the park electrode 26, and the deflected ion beam recovers to be along the beam trajectory line indicated by a two-dotted chain line in FIG. 5. Thereby, an ion beam comprising an ion of a predetermined mass in the ion beam passing the park electrode 26 passes the hole 120 of the mass analysis slit 28. Further, the ion beam passing the hole 120 of the mass analysis slit 28 advances to the beam scanner 36 arranged on the downstream side.

By providing the park electrode 26, even when the sectional shape of the ion beam is either of a normal circular shape and an elliptical or flat shape prolonged in a lateral direction (having long axis in lateral direction) or prolonged in the longitudinal direction (having long axis in longitudinal direction), the ion beam can excellently be evacuated at inside of the park housing 27 without being effected with an influence of the sectional shape of the ion beam. Further, a region on which the ion beam brought into a temporal evacuating state impinges is covered by the graphite member which is difficult to be sputtered by the ion beam, and therefore, an adverse influence of contamination or the like is not effected by sputtered particles on the downstream side of the mass analysis slit 28. Further, a magnetic field deflection may be adopted in place of an electric field deflection by the park electrode 26 as described above.

Next, an explanation will be given of an operation when a desired ion beam cannot be provided by generating a discharge phenomenon at the ion implantation apparatus 1 constituted as described above, and a simple explanation will be given of ion implantation at normal time before the explanation.

Figure 6:
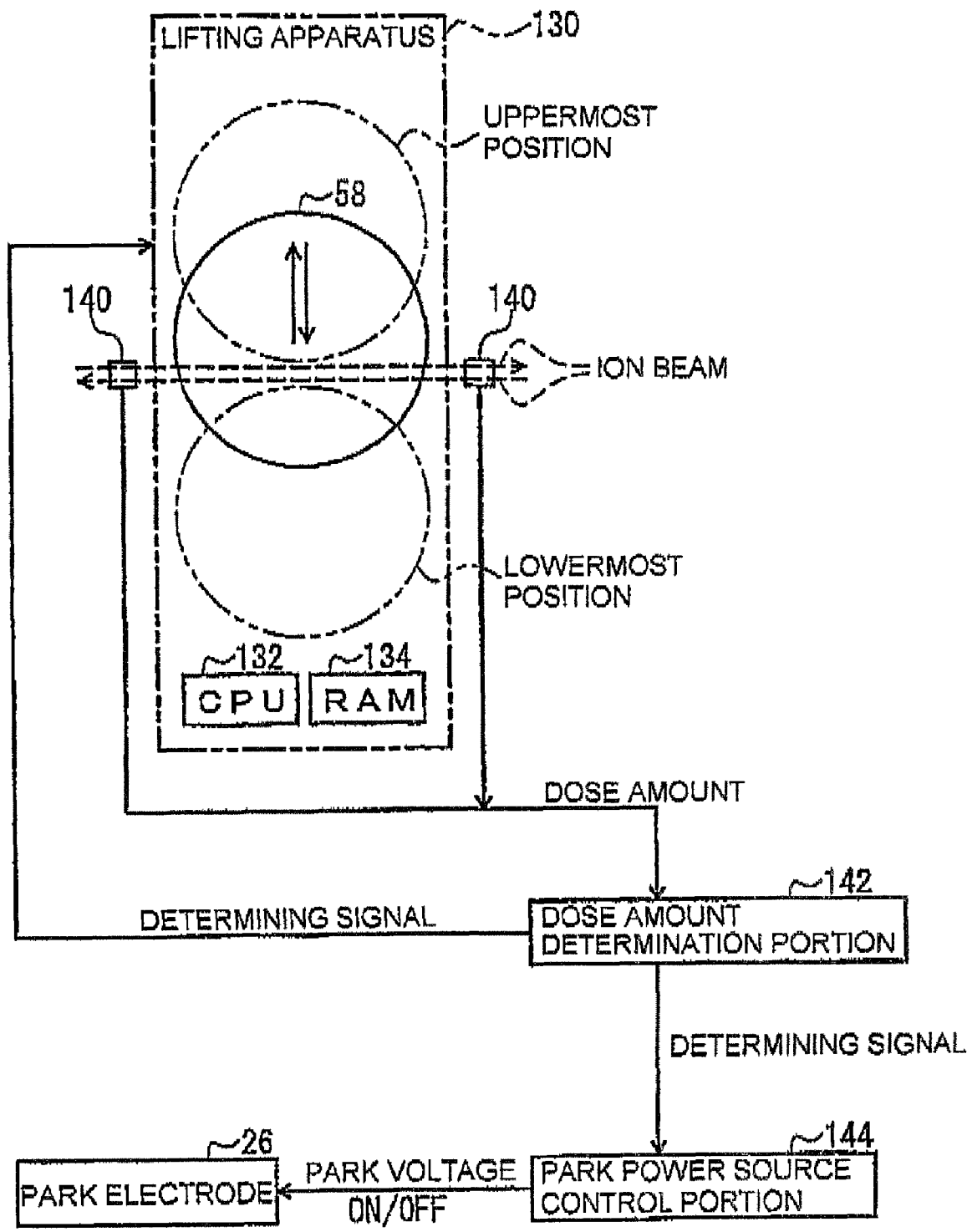
FIG. 6 is a view for explaining a behavior when an ion is implanted to a wafer in an ion implantation apparatus according to the present invention.

FIG. 6 is an explanatory view showing a behavior when an ion is implanted to the wafer 58. As shown by FIG. 6, a lifting apparatus 130 includes a platen (not illustrated) for holding the wafer 58, and moves up and down the wafer 58 by moving up and down the platen in the up and down direction. Further, the lifting apparatus 130 includes CPU (Central Processing Unit) 132 for carrying out control and RAM (Random Access Memory) 134 for storing a position information in the up and down direction of the wafer 58, and stores the position information of the wafer 58 as necessary. A pair of dose cups 140 are arranged at fixed positions at inside of a region of irradiating the ion beam, in this case, left and right positions of the lifting apparatus 130 for measuring a dose amount and outputting a measured value. A dose amount determination portion (resolving means) 142 determines whether the dose amount is proper based on the measured values from the pair of dose cups 140 and outputs a result of determination as a determining signal. Specifically, when the dose amount is equal to or larger than a predetermined value, the dose amount determination portion 142 outputs a determining signal indicating that the dose amount is proper (hereinafter, referred to as proper determining signal). On the other hand, when the dose amount is less than the predetermined value, the dose amount determination portion 142 outputs a determining signal indicating that the does amount is improper (hereinafter, referred to as improper determining signal).

As indicated by an arrow mark of a broken line (arrow mark in lateral direction), the ion beam is reciprocally scanned to traverse the pair of dose cups 140 by the beam scanner 36. When the wafer 58 is moved in the up and down direction as indicated by an arrow mark of a bold line (arrow mark in up and down direction) relative to the ion beam reciprocally scanned in the horizontal direction, an entire face of the wafer 58 is scanned by the ion beam. As a result, the ion of the ion beam is implanted to an entire face of the wafer 58. Specifically, the ion is implanted to the entire face of the wafer 58 during a time period of moving the wafer 58 from a lowermost position to an uppermost position, or from the uppermost position to the lowermost position.

Meanwhile, in a case in which a desired ion beam cannot be provided by a discharge phenomenon when the ion is implanted to the wafer 58 in this way, the dose amount measured by the dose cup 140 is reduced. Further, when the dose amount becomes less than the predetermined value, the dose amount determination portion 142 outputs an improper determining signal. When the improper determining signal is received, a park power source control portion (control means) 144 controls the park voltage to be applied to the park electrode 26. When the park voltage is applied, the park electrode 26 evacuates the ion beam instantaneously by deflecting the ion beam to the lower side from the beam trajectory line and the state is maintained for a predetermined time (for example, 2 seconds). As a result, the ion beam impinges on the graphite 122 of the mass analysis slit 28, or the graphite 122 at inside of the park housing 27. Therefore, the mass analysis slit 28 or the park housing 27 can be utilized as an evacuating location. In addition thereto, the ion beam is deflected to the graphite 122 at inside of the mass analysis slit 28 of the park housing 27, and therefore, the ion beam does not arrive at the wafer 58 and is not implanted to the wafer 58.

Further, when the improper determining signal is received, CPU 132 of the lifting apparatus 130 stores information of the position in the up and down direction of the wafer 58 to RAM 134 and evacuates the wafer 58 to a position at which an ion is not implanted thereto (outside of region of irradiating ion beam) for caution's sake. Specifically, in a case in which a position of implanting an ion to the wafer 58 is an upper side than a center of the wafer 58 when the discharge phenomenon occurred, the wafer 58 is evacuated from the region of irradiating the ion beam by moving up the wafer 58 to the uppermost position. On the other hand, in a case in which the position of implanting the ion is a lower side than the center of the wafer 58 when the discharge phenomenon occurred, the wafer 58 is evacuated from the region of irradiating the ion beam by moving down the wafer 58 to the lowermost position. Therefrom, the lifting apparatus 130 and CPU 132 are operated as wafer evacuating means.

Successively, when it is determined that the wafer 58 is evacuated to the uppermost position or the lowermost position by an elapse of a predetermined time period after receiving the improper determining signal, the park power source control portion 144 stops supplying the park voltage to the park electrode 26. As a result, the ion beam brought into the evacuated state recovers instantaneously to the beam trajectory line. When the ion beam recovers to the beam trajectory line, the periodical reciprocal scanning is carried out by the beam scanner 36, and therefore, the dose amount of the ion beam is measured by the dose cups 140. When the dose amount is equal to or larger than the predetermined value as a result of the measurement, the dose amount determination portion 142 outputs the proper determining signal. When the proper determining signal is received, the park power source control portion 144 applies the park voltage to the park electrode 26. When the park voltage is applied, the park electrode 26 evacuates the ion beam by instantaneously deflecting the ion beam to the lower side of the beam trajectory line. Further, when the proper determining signal is received, CPU 132 reads information of the position of the wafer 58 from RAM 134 and recovers the wafer 58 to a position when the discharge phenomenon is detected, by driving the lifting apparatus 130.

Next, when it is determined that the predetermined time period has elapsed after receiving the proper determining signal and the wafer 58 is recovered to the position before evacuating (position when discharge phenomenon is detected), the park power source control portion 144 stops applying the park voltage to the park electrode 26. When the park voltage is stopped from being applied to the park electrode 26, the deflection of the ion beam is stopped and the ion beam instantaneously recovers to the beam trajectory line. As a result, the ion beam transmitting through the hole 120 of the mass analysis slit 28 advances to the beam scanner 36 and the ion beam is reciprocally scanned in the horizontal direction periodically by the beam scanner 36. At this occasion, the wafer 58 recovers to the position when the discharge phenomenon is detected, and therefore, ion implantation can be restarted from a midway position when ion implantation is interrupted. Therefore, even when the discharge phenomenon is brought about accidentally, so far as the phenomenon continues within the predetermined time period, it is not difficult to ensure the uniformity of the ion beam or makes the dose amount uniform and the ion can be implanted uniformly to the wafer 58.

By providing the injector flag Faraday cup 32 by the above-described constitution, when the predetermined time period (for example, 2 seconds) has elapsed after receiving the improper determining signal indicating that the dose amount is improper and the dose amount is measured again, in a case in which the proper determining signal indicating that the dose amount is proper cannot be received, the ion beam is shut off by the injector flag Faraday cup 32 by advancing the injector flag Faraday cup 32 onto the beam trajectory line at the scanner housing 37. Naturally, temporary evacuating of the ion beam is released. By such an operation, the graphite 122 provided at the mass analysis slit 28 or the park housing 27 can be restrained from being sputtered without prolonging the time period of evacuating the ion beam by the deflecting apparatus. A control of the drive mechanism 32-1 can be realized by the park power source control portion 144.

According to the combination of the park electrode 26 and the injector flag Faraday cup 32 as explained above, high speed evacuating and temporary evacuating of the ion beam can be realized without effecting an influence on the peripheral member without effecting an influence on the diameter or the sectional shape of the ion beam. Further, when a desired ion beam cannot be provided by combining dose amount measurement means, dose amount determination means, moving means (lifting means) as wafer evacuating means and CPU and RAM and park power source controlling means, by combining the temporal evacuating operation of the ion beam and the evacuating operation of the wafer, a nonuniform ion beam can be prevented from being irradiated to the wafer and the ion can be implanted uniformly always to the wafer.

Further, the above-described embodiment can also be specified by being modified as follows.

Although the ion implantation apparatus 1 according to the above embodiment is provided with the mass analysis magnet apparatus 22, the present invention is applicable also to an ion implantation apparatus which is not provided with the mass analysis magnet apparatus. This is a case of supplying a gas (for example, hydrogen or the like) which does not need to separate an ion by the mass analysis magnet apparatus.

Figure 7A:
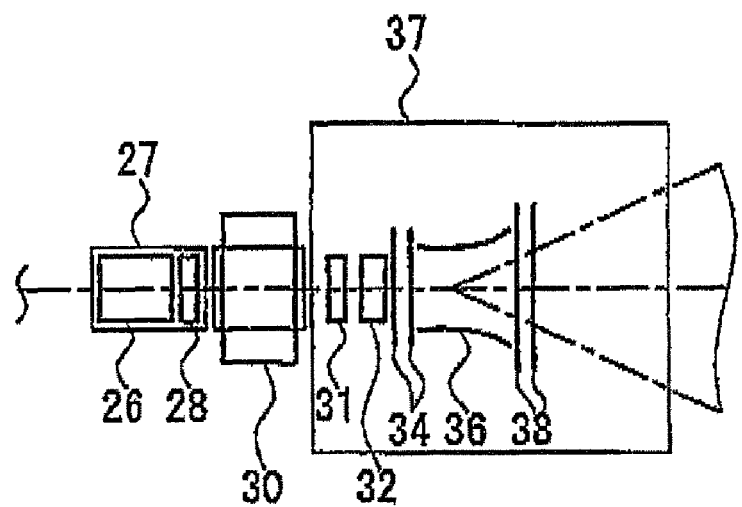
FIG. 7A is a plane view showing a combination example when a two wire type beam profile monitor is combined with the injector flag Faraday cup in an ion implantation apparatus according to the present invention.
Figure 7B:
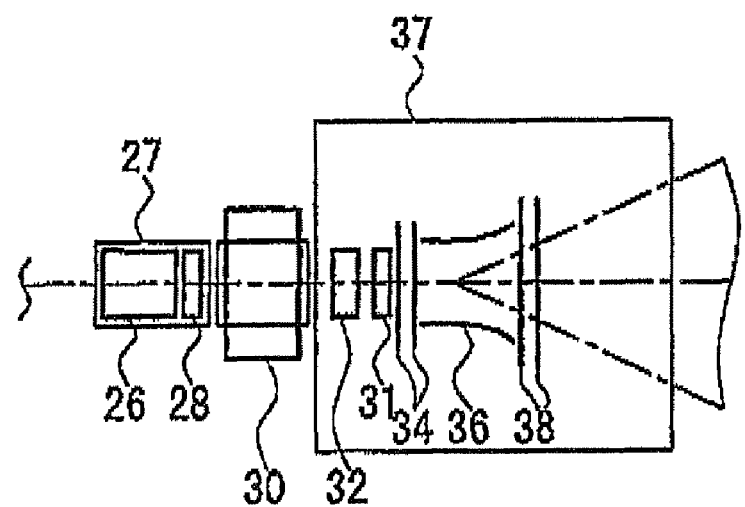
FIG. 7B is a plane view showing another combination example of FIG. 7A.

As shown by FIG. 7A and FIG. 7B, a two wire type beam profile monitor 31 for measuring a current density distribution of a section of the ion beam may be arranged to be able to be brought in and out to and from the beam trajectory line on an upstream side (FIG. 7A) or a downstream side (FIG. 7B) of an immediate vicinity of the injector flag Faraday cup 32. When constituted in this way, the quadrupole vertically focusing electromagnet 24 and the quadrupole vertically focusing electromagnet 30 can be adjusted based on the current density distribution measured by the two wire type beam profile monitor 31. Further, the quadrupole vertically focusing electromagnet 24 and the quadrupole vertically focusing electromagnet 30 can be adjusted also by comparing data measured by the triple surface beam dump 80 and data measured by the two wire type beam profile monitor 31.

Although according to the embodiment, there is constructed a constitution of periodically scanning reciprocally the ion beam in the horizontal direction orthogonal to the direction of advancing the ion beam, instead thereof, there may be constructed a constitution of periodically scanning reciprocally the ion beam in a specific direction other than the horizontal direction, for example, a vertical direction.

Although according to the embodiment, the present invention is applied to an ion implantation apparatus of a single wafer type, instead thereof, the present invention may be applied to an ion implantation apparatus of a batch type.

What is claimed is:

1. An ion implantation apparatus including a beam line arranged to implant an ion to a wafer by irradiating an ion beam, the ion beam arranged to be extracted from an ion source and running over the beam line and being passed through a mass analysis magnet apparatus and a mass analysis slit to the wafer on the beam line, and after passing the mass analysis slit on the beam line, the ion beam being arranged to reciprocally scanned by a beam scanner,
    wherein the ion implantation apparatus further includes:
    an injector flag Faraday cup arranged on the beam line after passing a second quadrupole vertically focusing electromagnet and before incidence of the beam scanner, the Faraday cup being adapted to detect a full beam current by measuring a total beam amount of the ion beam to be able to be brought in and out thereto and therefrom, the Faraday cup that shuts off the ion beam as necessary, entering or leaving against the beam line before incidence of the beam scanner on the beam line, and then the ion beam full stopping, receiving, measuring or full passing on the beam line just before the beam scanning, and
    a scanner housing that contains the beam scanner and the Faraday cup,
    the Faraday cup being arranged immediately after an ion beam inlet at the scanner housing and the beam scanner being arranged immediately after the Faraday cup, the Faraday cup being provided with an incident beam receiving area in correspondence with a sectional shape of the ion beam which is constituted by an elliptical or a flat shape having a long axis in a lateral direction by shaping with the second quadrupole vertically focusing electromagnet,
    the incident beam receiving area of the Faraday cup being constituted by a rectangular shape slightly larger than a sectional shape of the ion beam.

2. The ion implantation apparatus according to claim 1, wherein a shape of a beam incident portion at the Faraday cup is constituted by a rectangular shape to be able to deal with an ion beam having a section in an elliptical shape having a long axis in a lateral direction or a longitudinal direction.

3. The ion implantation apparatus according to claim 1, wherein a drive mechanism that brings in and out the Faraday cup to and from the beam line is installed at outside of the scanner housing and the Faraday cup is attached to a drive shaft of the drive mechanism introduced into the scanner housing by penetrating an wall of the scanner housing.

4. The ion implantation apparatus according to claim 1, further including a beam dump arranged at a most downstream position of the beam line and having a beam current detecting function, wherein a beam transporting efficiency is made to be able to be calculated by comparing a detected value of the Faraday cup and a detected value of the beam dump.

5. The ion implantation apparatus according to claim 1, further including a profile monitor arranged to measure a current density distribution of a section of the ion beam, wherein the profile monitor is arranged at a immediate vicinity on an upstream side or an immediate vicinity on a downstream side of the Faraday cup at inside of the scanner housing.

6. The ion implantation apparatus according to claim 1, further including:
    dose amount measurement means arranged at a vicinity of the wafer;
    resolving means that determines whether the measured dose amount is not less than a predetermined value;
    a deflecting apparatus arranged at a section of the beam line from an outlet of the mass analysis magnet apparatus to a front side of the mass analysis slit for deflecting the ion beam in a predetermined direction deviated from the beam trajectory line and maintaining the deflection; and
    control means that carries out temporal evacuating of the ion beam by the deflecting apparatus when the dose amount measured in implanting the ion is determined to be less than the predetermined value by the resolving means;
    wherein the control means recovers the ion beam to the beam trajectory line by stopping the temporal evacuating of the ion beam when a predetermined time period has elapsed since the dose amount has been determined to be less than the predetermined value; and
    wherein when the dose amount remeasured by the dose amount measurement means is determined to be less than the predetermined value again, the control means inserts the Faraday cup to the beam line and releases the temporal evacuating of the ion beam.

* * * * *